US009425350B2

(12) United States Patent
Tanaka (10) Patent No.: US 9,425,350 B2
(45) Date of Patent: Aug. 23, 2016

(54) PHOTOCOUPLER AND LIGHT EMITTING ELEMENT

(71) Applicant: Kabushiki Kaisha Toshiba, Minato-ku, Tokyo (JP)

(72) Inventor: Kazuki Tanaka, Fukuoka-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 14/201,674

(22) Filed: Mar. 7, 2014

(65) Prior Publication Data

US 2015/0069422 A1   Mar. 12, 2015

(30) Foreign Application Priority Data

Sep. 11, 2013   (JP) .................................. 2013-188859

(51) Int. Cl.
*H01L 33/02* (2010.01)
*H01L 31/167* (2006.01)
*H01L 33/00* (2010.01)
*H01L 25/16* (2006.01)

(52) U.S. Cl.
CPC .............. *H01L 33/02* (2013.01); *H01L 25/167* (2013.01); *H01L 31/167* (2013.01); *H01L 33/00* (2013.01); *H01L 2924/0002* (2013.01)

(58) Field of Classification Search
CPC ................................. H01L 33/02; H01L 33/00
See application file for complete search history.

(56) References Cited

U.S. PATENT DOCUMENTS 6,180,961 B1 * 1/2001 Ogihara et al. ................. 257/94
6,413,627 B1 * 7/2002 Motoki ................... C30B 25/02
117/952
2003/0001162 A1 * 1/2003 Udagawa ......................... 257/79
2005/0023441 A1 * 2/2005 Inoue et al. ................. 250/214.1
2005/0145873 A1 * 7/2005 Pan et al. ....................... 257/103
2007/0187629 A1   8/2007 Matsuyama
2008/0303017 A1 * 12/2008 Ohya ..................... B82Y 20/00
257/13

(Continued)

FOREIGN PATENT DOCUMENTS

JP          03-001455 U       1/1991
JP          05-013807 A       1/1993

(Continued)

OTHER PUBLICATIONS

Armitage et al., "Electrical and Optical Properties of Carbon-Doped GaN Grown by MBE on MOCVD GaN Templates Using a CCl4 Dopant Source", Mat. Res. Soc. Symp. Proc. vol. 719, 2002, pp. F1.2.1-F1.2.6.*

(Continued)

*Primary Examiner* — Matthew Reames
*Assistant Examiner* — Vincent Wall
(74) *Attorney, Agent, or Firm* — White & Case LLP (57) ABSTRACT

According to one embodiment, a photocoupler includes: an input terminal; a light emitting unit; a light receiving unit and an output terminal. An input electrical signal having a prescribed voltage is input into an input terminal. The light emitting unit is connected to the input terminal, includes a light emitting element configured to emit emission light, and is configured to drive the light emitting element under a constant voltage of the input electrical signal. The light receiving unit includes a light receiving element configured to receive the emission light and convert the emission light into an electrical signal. The output terminal is insulated from the input terminal and configured to output the electrical signal in accordance with the input electrical signal.

19 Claims, 5 Drawing Sheets

(56) References Cited

U.S. PATENT DOCUMENTS

| | | |
|---|---|---|
| 2013/0069082 A1 | 3/2013 | Okada et al. |
| 2013/0153920 A1 | 6/2013 | Sugawara |
| 2013/0161669 A1* | 6/2013 | Chen .................... H01L 33/145 257/98 |
| 2014/0203296 A1 | 7/2014 | Sugawara |

FOREIGN PATENT DOCUMENTS

| | | | | |
|---|---|---|---|---|
| JP | 06224245 A | * | 8/1994 | |
| JP | H06224245 A | * | 8/1994 | ............. B29C 45/02 |
| JP | 11-186892 A | | 7/1999 | |
| JP | 2007-165621 A | | 6/2007 | |
| JP | 2009-147079 A | | 7/2009 | |
| JP | 2011-254013 A | | 12/2011 | |
| JP | 2013-042517 A | | 2/2013 | |
| JP | 2013-048162 A | | 3/2013 | |
| JP | 2013-048163 A | | 3/2013 | |
| TW | DE 10344325 A1 | * | 8/2004 | ............. H01L 33/02 |
| WO | 2013-036416 A1 | | 3/2013 | |

OTHER PUBLICATIONS

Gessman et al., "Sheet Resistance Mapping for GaN-Based light-Emitting Diodes Using Lehighton Electronics LEI-1510 INstruments".*

JP H06-224245A—machine translation.*

JPS6332971 espacenet bibliographic data.*

Japanese Office Action issued on Jan. 6, 2016 in counterpart Japanese patent application No. 2013-188859, and an English translation thereof.

Japanese Office Action issued on Apr. 6, 2016 in counterpart Japanese patent application No. 2013-188859 with an English translation thereof.

* cited by examiner

PHOTOCOUPLER AND LIGHT EMITTING ELEMENT

CROSS-REFERENCE TO RELATED APPLICATIONS

This application is based upon and claims the benefit of priority from Japanese Patent Application No. 2013-188859, filed on Sep. 11, 2013; the entire contents of which are incorporated herein by reference.

FIELD

Embodiments described herein relate generally to a photocoupler and a semiconductor light emitting element.

BACKGROUND

A photocoupler including a photorelay can convert an input electrical signal into an optical signal using a light emitting element, receive light using a light receiving element, and then output an electrical signal. Hence, the photocoupler can transmit an electrical signal in a state where the input side and the output side are insulated from each other.

In equipment such as industrial equipment, office equipment, and household electrical equipment, in many cases different power supply systems such as a DC voltage system, an AC power supply system, a telephone line system, and a control system are arranged in one device. However, if different power supply systems and circuit systems are directly connected, an operational malfunction may occur.

If the photocoupler is used, insulation is provided between different power sources and therefore the operational malfunction can be suppressed.

For example, a large number of photocouplers, including those for AC loads, are used in inverter air conditioners etc. In the case of being used for signal switching for LSI tester uses, a very large number of photocouplers are mounted. In such a case, downsizing is strongly required from the necessity to reduce the area of mounting onto a substrate.

DETAILED DESCRIPTION

According to one embodiment, a photocoupler includes: an input terminal; a light emitting unit; a light receiving unit and an output terminal. An input electrical signal having a prescribed voltage is input into an input terminal. The light emitting unit is connected to the input terminal, includes a light emitting element configured to emit emission light, and is configured to drive the light emitting element under a constant voltage of the input electrical signal. The light receiving unit includes a light receiving element configured to receive the emission light and convert the emission light into an electrical signal. The output terminal is insulated from the input terminal and configured to output the electrical signal in accordance with the input electrical signal.

Hereinbelow, embodiments of the invention are described with reference to the drawings.

Figure 1:
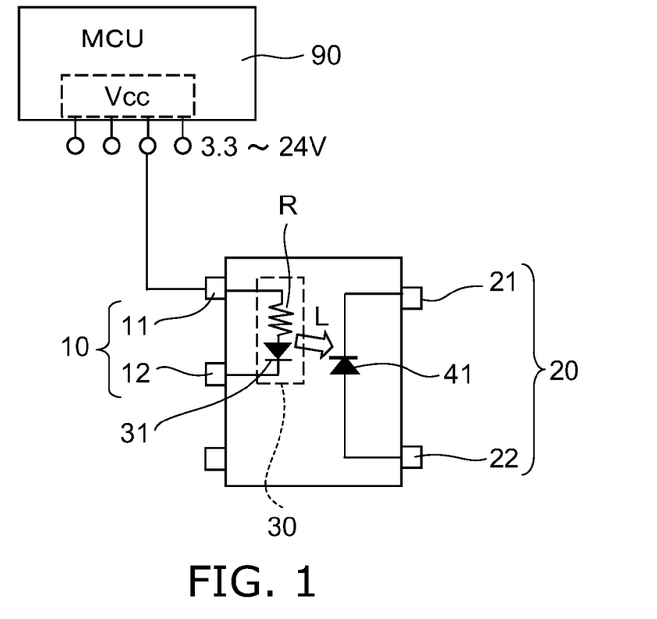
FIG. 1 is a configuration diagram showing the configuration of a photocoupler according to a first embodiment of the invention.

FIG. 1 is a configuration diagram showing the configuration of an optical coupling device according to a first embodiment of the invention.

The photocoupler includes an input terminal 10, a light emitting unit 30, a light receiving unit including a light receiving element 41, and an output terminal 20.

An input electrical signal having a prescribed voltage is inputted to the input terminal 10. The light emitting unit 30 is provided between a first input lead 11 and a second input lead 12 of the input terminal 10, includes a light emitting element 31 that emits emission light L of near infrared wavelengths (700 to 1100 nm) or the like, and voltage-drives the light emitting element 31 by means of the input electrical signal. The light emitting element 31 may be an LED (light emitting diode) or the like. The wavelength of the emission light is not limited to near infrared light.

The light receiving element 41 is provided between a first output lead 21 and a second output lead 22 of the output terminal 20, and receives the emission light L and converts it into an electrical signal. The light receiving element 41 may be a photodiode, a phototransistor, a phototriac, or the like. The output terminal 20 is insulated from the input terminal 10, and outputs an electrical signal corresponding to the input electrical signal.

The power supply voltage Vcc of an MCU (micro-controller unit) 90 that drives the photocoupler is 3.3, 5, 12, or 24 V, or the like, for example. In the first embodiment, the light emitting unit 30 of the photocoupler has a resistance R. Therefore, the prescribed power supply voltage of the MCU 90 can be constant and directly applied to the input terminal 10 of the photocoupler. As the result, the light emitting element 31 can be driven under the constant voltage. The power supply voltage Vcc of the MCU 90 is 12 V and the trigger current of the photocoupler is 20 mA, for example. If the forward voltage of the light emitting element 31 is set to 2 V, the value of the resistance R may be set to substantially 500Ω.

Figure 2:
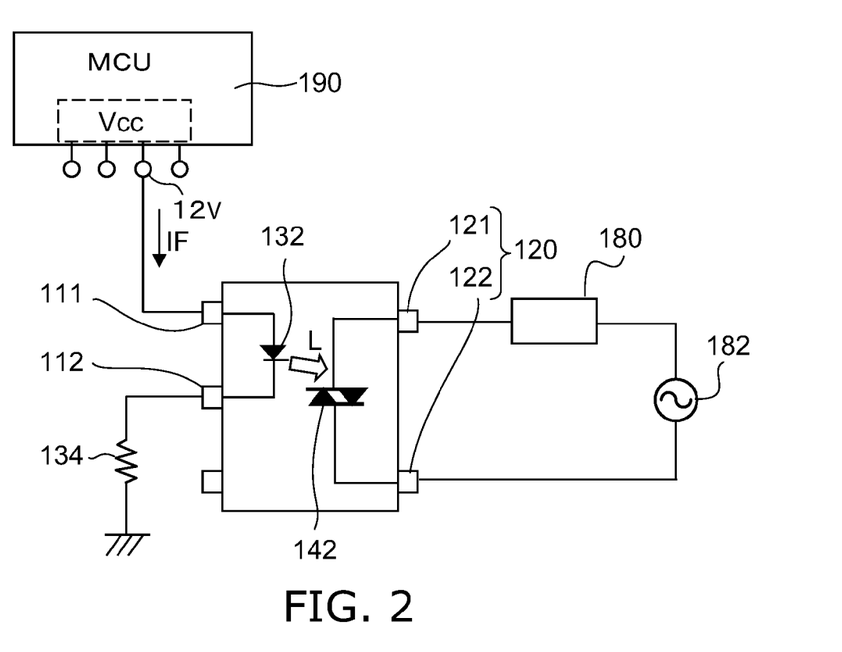
FIG. 2 is a configuration diagram of an application example of the photocoupler according to a comparative example.

FIG. 2 is a configuration diagram of an application example of the photocoupler according to a comparative example.

A light emitting element 132 is connected in series to an external resistance 134 via a lead 112. When the output voltage of an MCU 190 is set to 12 V and the value of the external resistance 134 is set to 1.3 kΩ, the light emitting element 132 can be driven with a forward current IF of 8 mA through a lead 111 and the lead 112, for example. In this case, an interconnection unit is needed on a circuit board, and the resistance R is attached by soldering or the like.

A light receiving element 142 is assumed to be a phototriac 142. In the comparative example, a load 180 and a power source 182 are connected to an output terminal 120. A gear motor or the like may be used as the load 180, for example. An AC power source or the like may be used as the power source 182. By such a configuration, the output terminal 120 can switch an AC signal to ON or OFF in accordance with the input electrical signal.

However, in communication electronic equipment, industrial electronic equipment, and the like, it is required to arrange a large number of photocouplers at high density. Thus, there is a problem that when external add-on components are present, the mounting processes are increased and the electronic equipment has a large size.

In contrast, according to the present embodiment, since the light emitting unit 30 can be driven by using constant voltage, no external resistance is needed outside the photocoupler. Hence, the photocoupler can be direct driven by the power supply voltage Vcc of the MCU 90, and the electronic equipment can be downsized. Furthermore, since the light emitting element 31 is driven by the constant voltage, the thermal properties and long term reliability can be improved.

FIGS. 3A to 3E are schematic cross-sectional views of upper/lower electrode-type light emitting elements in which a resistance is incorporated.

In the light emitting unit 30 of the photocoupler of the first embodiment, the resistance R may be provided in the light emitting element 31. The light emitting element 31 includes a substrate 32 and a semiconductor stacked body 34. In the structure shown in FIGS. 3A to 3E, the substrate 32 having electrical conductivity and the semiconductor stacked body 34 are bonded via a bonding metal layer 33. The substrate 32 is Si, GaAs, or the like, for example. The semiconductor stacked body 34 includes a light emitting layer 34a, and may be AlGaAs, InAlGaP, or the like, for example. The two layers sandwiching the light emitting layer 34a have conductivity types opposite to each other.

A first electrode 37 is provided on the upper surface of the semiconductor stacked body 34, and a second electrode 36 is provided on the back surface of the substrate 32; and the current path is mainly in the vertical direction. The emission light L is emitted mainly from regions outside the first electrode 37 to the upper side.

Figure 3A:
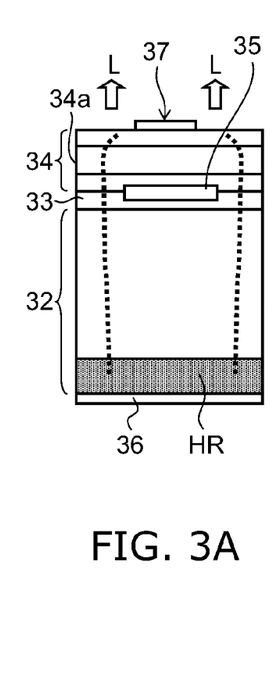
FIGS. 3A to 3E are schematic cross-sectional views of upper/lower electrode-type light emitting elements in which a resistance is incorporated.

In the example shown in FIG. 3A, a first current blocking layer 35 is an insulating layer such as a silicon oxide film. A resistance layer HR is provided on the second electrode 36 side of the substrate 32. Carriers flow along the dotted lines. Thus, the resistance layer HR is connected in series to the p-n junction of the light emitting element 31. The value of the resistance R is determined from the thickness of the resistance layer HR, the effective area (subtracting the effective area of the current blocking layer from the cross-sectional area of the resistance layer), and the resistivity ρ of the resistance layer HR.

Table 1 shows the dependence of the operating current on the thickness T of the resistance layer when the power supply voltage Vcc is 3.3 V and 5 V. The resistivity ρ depends on the semiconductor material and the conductivity type, as shown in Table 1.

resistivity ρ of the resistance layer HR is set to 10 Ω·cm. At this time, the drive current is 43 mA when the thickness T of the resistance layer HR=5 μm; the drive current is 22 mA when the thickness T of the resistance layer HR=50 μm; the drive current is 10 mA when the thickness T of the resistance layer HR=150 μm; etc. Thus, the necessary resistance value is determined in accordance with the power supply voltage Vcc and the drive current of the light emitting element 31. The thickness T and the resistivity of the resistance layer HR can be determined in accordance with the resistance value.

Figure 3B:
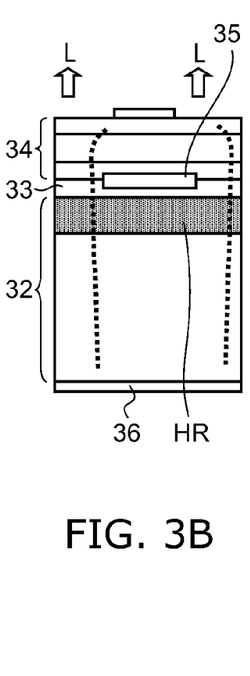
Figure 3C:
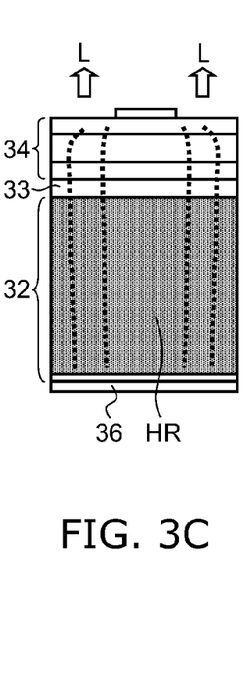
Figure 3D:
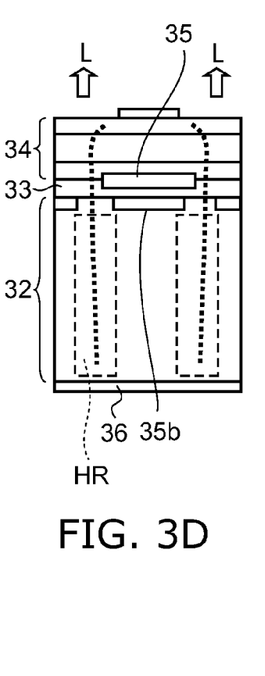
Figure 3E:
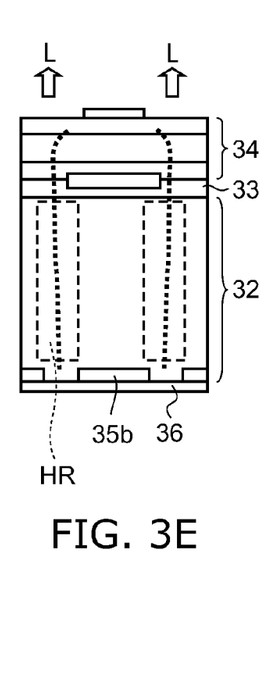

In the example shown in FIG. 3B, the resistance layer HR is provided on the side of the semiconductor stacked body 34. In the specific example shown in FIG. 3C, the resistance layer HR is formed over almost the entire thickness of the substrate 32. In the example shown in FIG. 3D, a second current blocking layer 35b provided with a silicon oxide film having an opening or the like is provided between the bonding metal layer 33 and the substrate 32. As shown in FIG. 3E, the second current blocking layer 35b is provided between the substrate 32 and the second electrode 36. Although the resistivity of the substrate 32 may be substantially uniform in FIGS. 3D and 3E, the resistance value is increased by narrowing the current path by means of the second current blocking layer 35b.

Figure 4A:
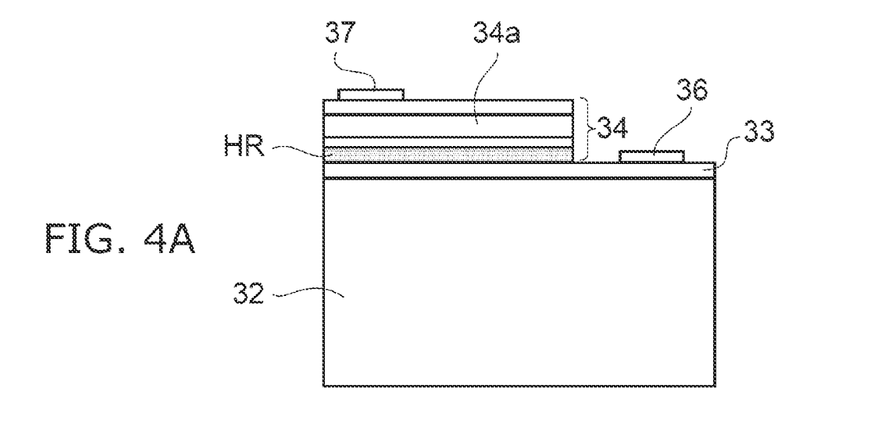
FIG. 4A and FIG. 4B are schematic cross-sectional views of light emitting elements of an upper two electrode type.
Figure 4B:
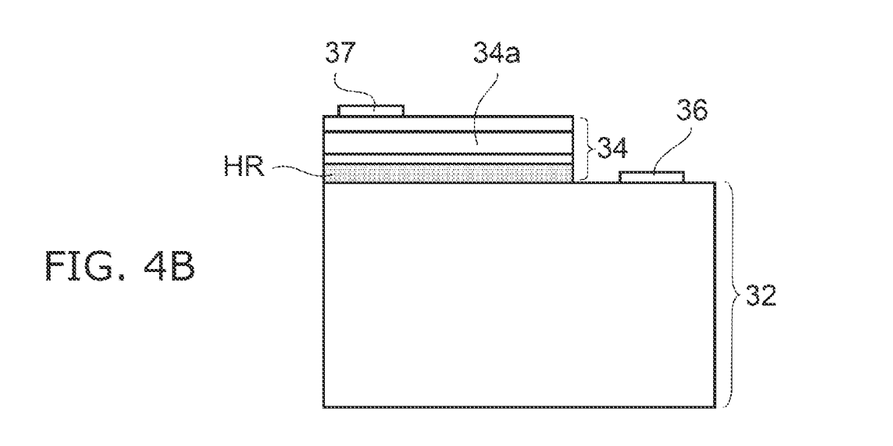

FIG. 4A and FIG. 4B are schematic cross-sectional views of light emitting elements of an upper two electrode type.

In the example shown in FIG. 4A, the semiconductor stacked body 34 includes the resistance layer HR on the substrate 32 side. The second electrode 36 is provided on the bonding metal layer 33. The substrate 32 may be insulating or semi-insulating. In the example shown in FIG. 4B, the second electrode 36 is provided directly on the surface of the substrate 32.

Figure 5A:
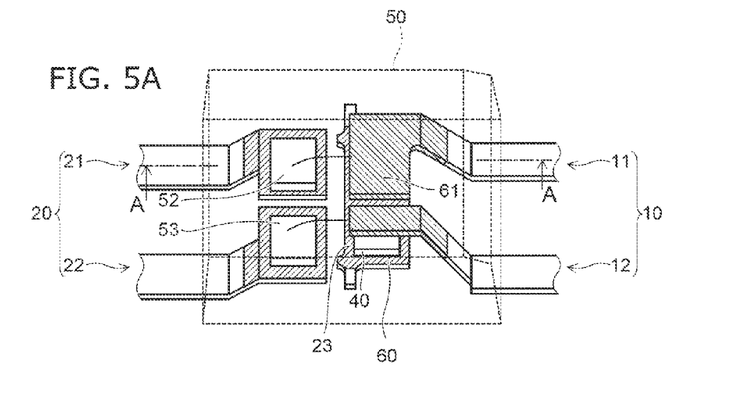
FIG. 5A is a schematic perspective view of a photocoupler according to a second embodiment.
Figure 5B:
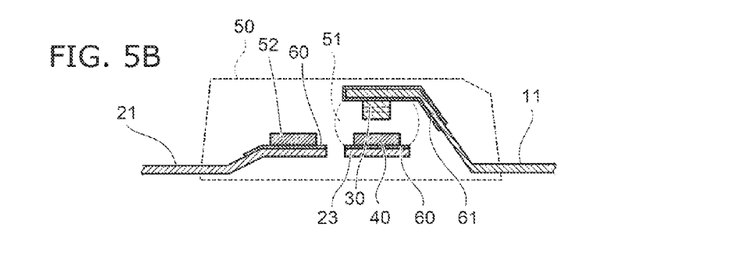
FIG. 5B is a schematic cross-sectional view taken along line A-A.
Figure 5C:
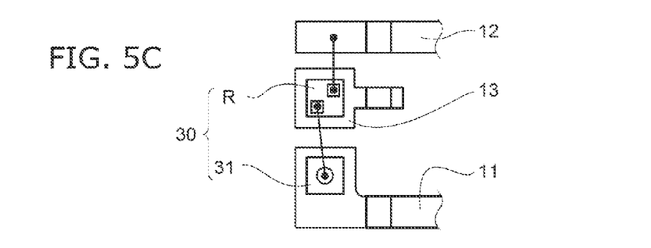
FIG. 5C is a schematic bottom view of an input terminal of a modification example of the second embodiment.

FIG. 5A is a schematic perspective view of a photocoupler according to a second embodiment, FIG. 5B is a schematic cross-sectional view taken along line A-A, and FIG. 5C is a schematic bottom view of an input terminal of a modification example of the second embodiment.

Figure 6:
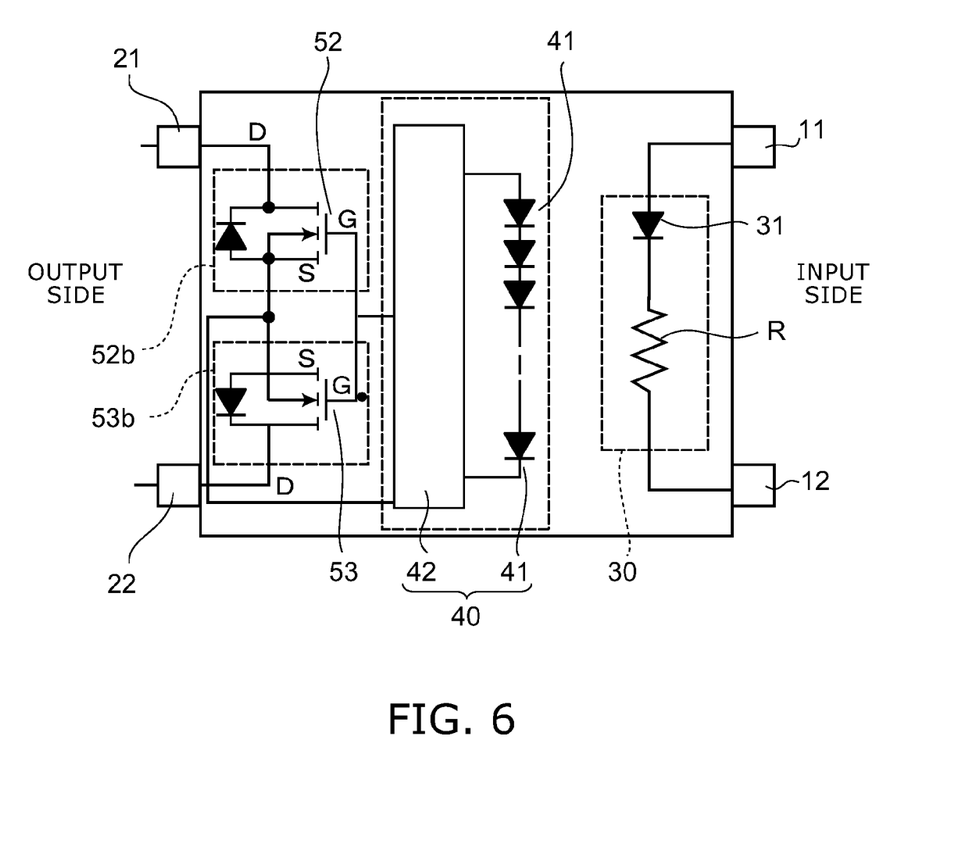
FIG. 6 is a configuration diagram of a photocoupler according to the second embodiment.

FIG. 6 is a configuration diagram of a photocoupler according to the second embodiment.

The photocoupler includes the input terminal 10, a die pad unit 23, the light emitting unit 30, a light receiving unit 40, MOSFETs 52 and 53, and the output terminal 20.

FIG. 5B is a schematic cross-sectional view that includes line A-A of the surfaces of the input first lead 11 and the output first lead 21 and is in a plane perpendicular to these surfaces. As shown in FIGS. 5A and 5B, the input terminal 10 includes the first input lead 11 and the second input lead 12. An input electrical signal having a prescribed voltage is inputted to the input terminal 10. When a first Ag layer 61 is provided on the surface of the lead frame on the input terminal 10 side, the light extraction efficiency can be enhanced.

TABLE 1

| Vcc | Operating current (mA) | | | ρ | GaAs | | Si | |
|-----|--------|-------|-------|---------|--------|--------|-----------|-----------|
| (V) | 150 μm | 50 μm | 5 μm  | (Ω·cm) | p-type | n-type | p-type    | n-type    |
| 3.3 | 6.9    | 14.3  | 28.1  | 10      | 2E+15  | 1E+14  | 1.3E+15   | 4.4E+15   |
| 5   | 10     | 22    | 43    | 10      |        |        |           |           |
| 3.3 | —      | 5     | 20    | 50      | 5E+14  | 2E+15  | 2.6E+14   | 8.7E+13   |
| 5   | —      | 7     | 30    | 50      |        |        |           |           |
| 3.3 | —      | —     | 14.3  | 100     | 2E+14  | 1E+13  | 1.3E+14   | 4.3E+13   |
| 5   | —      | —     | 21.7  | 100     |        |        |           |           |

For the light emitting element 31, the operating current is substantially 20 mA when the forward voltage is 2 V, for example. The power supply voltage Vcc is set to 5 V, and the The light emitting element 31 is bonded to the first input lead 11 of the input terminal 10. The back surface of the light emitting element 31 is electrically connected to the first input lead 11, for example. The electrode of the upper surface of the light emitting element 31 is connected to the second input lead 12 by a bonding wire or the like. The light emitting element 31 includes a substrate and a semiconductor stacked body provided on the substrate, and emits emission light of near infrared wavelengths. The light emitting element 31 has a structure like those shown in FIGS. 3A to 3E or FIGS. 4A and 4B, and is voltage-driven by the resistance layer HR provided in the substrate 32 or in the semiconductor stacked body 34.

The light receiving unit 40 includes the light receiving element 41 bonded to the die pad unit 23 so as to oppose the light emitting element 31. The light receiving unit 40 may further include a control unit 42. The light receiving element 41 has a p-n junction, and receives the emission light of the light emitting element 31 to generate photovoltaic power. The light receiving element 41 may be a photodiode array, for example. Although the drawings show an opposed-type structure in which a resin and lead frames are integrally molded, also a reflection-type structure, a substrate-type structure, etc. in which a resin and lead frames are integrally molded are possible.

The two MOSFETs 52 and 53 are connected in a common-source connection. The photovoltaic power generated in the light receiving element 41 is supplied between the gate G and the source S of the MOSFET 52 and between the gate G and the source S of the MOSFET 53. In the case where the two MOSFETs 52 and 53 are configured to be, for example, an enhancement type, when the optical signal is ON, electricity is conducted between the output first lead 21 and the output second lead 22.

When a depletion type is employed, ON and OFF can be reversed. In both structures, the two MOSFETs 52 and 53 are configured to be of the same polarity. The MOSFET 52 has a parasitic diode 52b. The MOSFET 53 has a parasitic diode 53b.

The output terminal 20 is insulated from the input terminal 10, is connected to the drains D of the two MOSFETs 52 and 53, and outputs an electrical signal in accordance with the input electrical signal. When the optical signal is OFF, electricity is not conducted between the output first lead 21 and the output second lead 22. That is, the output side is switched to ON or OFF in accordance with the input electrical signal. When the output side of the photocoupler is ON, a current can be supplied from the power source to the load when the voltage of the power source is either plus or minus. However, the current direction is opposite. The output terminal 20 and the die pad unit 23 are usually connected together when they are in the lead frame state. When a second Ag layer 60 is provided on the surface of the lead frame, the light extraction efficiency can be enhanced. The output terminal 20 and the die pad unit 23 to which the light emitting element 31 is bonded are separated by the lead cut process after resin molding.

In the case of DC load control, the number of MOSFETs may be one.

One end of the input terminal 10, one end of the output terminal 20, the light emitting unit 30, the light receiving unit 40, and the MOSFETs 52 and 53 are sealed with a sealing resin layer 50.

Such an photocoupler can be called a photorelay, and has a switching function similarly to a mechanical relay. A photorelay with a small size and high switching speed is used particularly for testers for LSIs, communication electronic equipment, amusement equipment, etc. In this case, it is required to arrange 1000 or more photorelays at high density. If it is attempted to make constant-voltage driving by providing an external resistance on a circuit substrate, it is necessary to provide an interconnection unit for attachment on the circuit substrate, and there are limitations to the downsizing of the equipment. In contrast, by incorporating a resistance into the light emitting unit 30 of the photorelay, the downsizing of the electronic equipment is enabled.

FIG. 5C shows the case where the light emitting unit 30 includes the light emitting element 31 and the resistance R in the photocoupler of the second embodiment.

FIG. 5C is a schematic bottom view in which the light emitting element 31 side is viewed from the light receiving element 41 in FIG. 5B. A die pad unit 13 for resistance attachment is further provided, and the resistance R is attached to the die pad unit 13. One electrode of the resistance R is connected to the light emitting element 31, and the other electrode of the resistance R is connected to the second input lead 12. Also by such a configuration, the downsizing of the electronic equipment is enabled.

The first and second embodiments provide an photocoupler and a light emitting element in which a resistance for voltage driving is not needed and it is easy to make high density mounting on a circuit substrate. Electronic equipment in which 1000 or more photocouplers, for example, of the embodiment are mounted at high density on a circuit substrate can be downsized easily.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A photocoupler comprising:
    an input terminal to which an input electrical signal having a prescribed voltage is input;
    a light emitting unit connected to the input terminal, including a light emitting element configured to emit emission light, the light emitting unit being formed on a substrate;
    a light receiving unit including a light receiving element configured to receive the emission light and convert the emission light into an electrical signal; and
    an output terminal insulated from the input terminal and configured to output the electrical signal in accordance with the input electrical signal,
    wherein
    the light emitting unit comprises a bonding layer between the substrate and the light emitting element, the light emitting element comprising a light emitting layer formed between layers having opposite conductivity and the bonding layer is a metal layer, and
    a resistance layer is provided in the substrate so that a part of the substrate comprises the resistance layer, such that a constant voltage of the input electrical signal drives the light emitting element, wherein the resistance layer comprises a semiconductor material and has a resistivity between 10 $\Omega$·cm and 100 $\Omega$·cm.

2. The photocoupler according to claim 1, wherein the light emitting unit further includes a resistance connected in series to the light emitting element.

3. The photocoupler according to claim 1, further comprising:

a MOSFET having a gate, the electrical signal from the light receiving unit being input to the gate.

4. The photocoupler according to claim 1, wherein the light receiving element is one of a photodiode, a photodiode array, a phototransistor, and a phototriac.

5. The photocoupler according to claim 1, wherein the resistance layer is adjacent to the bonding layer.

6. The photocoupler according to claim 1, wherein the resistance layer has a thickness between 5 μm and 150 μm.

7. The photocoupler according to claim 1, wherein the resistance layer and the substrate comprise the same semiconductor material.

8. A photocoupler comprising:
an input terminal to which an input electric signal having a prescribed voltage is input;
a light emitting unit connected to the input terminal, including a light emitting element configured to emit emission light, the light emitting element being formed on a substrate;
a light receiving unit including a light receiving element having a p-n junction and configured to receive the emission light and generate photovoltaic power;
two MOSFETs connected in a common-source connection and including gates and drains, the photovoltaic power form the light receiving unit being input into each gate; and
an output terminal insulated from the input terminal, connected to each drain, and configured to output an electrical signal in accordance with the input electrical signal,
wherein
the light emitting element comprises a bonding layer between the substrate and the light emitting element, the light emitting element comprising a light emitting layer formed between layers having opposite conductivity and the bonding layer is a metal layer, and
a resistance layer is provided in the substrate so that a part of the substrate comprises the resistance layer, such that a constant voltage of the input electrical signal drives the light emitting element, wherein the resistance layer comprises a semiconductor material and has a resistivity between 10 Ω·cm and 100 Ω·cm.

9. The photocoupler according to claim 8, wherein the light receiving element is one of a photodiode, a photodiode array, a phototransistor, and a phototriac.

10. The photocoupler according to claim 8, wherein the resistance layer is adjacent to the bonding layer.

11. The photocoupler according to claim 8, wherein the resistance layer has a thickness between 5 μm and 150 μm.

12. The photocoupler according to claim 8, wherein the resistance layer and the substrate comprise the same semiconductor material.

13. A light emitting element unit comprising;
a substrate;
a light emitting element being formed on the substrate; and
a bonding layer between the substrate and the light emitting element, wherein
the light emitting element comprises a light emitting layer formed between layers having opposite conductivity and the bonding layer is a metal layer, and
a resistance layer is provided in the substrate so that a part of the substrate comprises the resistance layer, such that a constant voltage of the input electrical signal drives the light emitting element, wherein the resistance layer comprises a semiconductor material and has a resistivity between 10 Ω·cm and 100 Ω·cm.

14. The unit according to claim 13, wherein the resistance layer is provided over an entire thickness direction of the substrate.

15. The unit according to claim 13, wherein the resistance layer is provided in a prescribed region in a thickness direction of the substrate.

16. The unit according to claim 13, further comprising:
a current blocking layer of an insulating film provided with an opening and provided in the substrate or in the semiconductor stacked body.

17. The photocoupler according to claim 13, wherein the resistance layer is adjacent to the bonding layer.

18. The unit according to claim 13, wherein the resistance layer has a thickness between 5 μm and 150 μm.

19. The unit according to claim 13, wherein the resistance layer and the substrate comprise the same semiconductor material.

* * * * *